United States Patent
Tao et al.

(10) Patent No.: US 11,515,406 B2
(45) Date of Patent: Nov. 29, 2022

(54) HETEROJUNCTION BIPOLAR TRANSISTOR WITH FIELD PLATES

(71) Applicant: QUALCOMM Incorporated, San Diego, CA (US)

(72) Inventors: Gengming Tao, San Diego, CA (US); Bin Yang, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 827 days.

(21) Appl. No.: 16/379,904

(22) Filed: Apr. 10, 2019

(65) Prior Publication Data
US 2020/0328293 A1 Oct. 15, 2020

(51) Int. Cl.
*H01L 29/737* (2006.01)
*H01L 29/40* (2006.01)
*H01L 29/66* (2006.01)
*H03F 3/19* (2006.01)

(52) U.S. Cl.
CPC ........ *H01L 29/7371* (2013.01); *H01L 29/402* (2013.01); *H01L 29/66242* (2013.01); *H03F 3/19* (2013.01); *H03F 2200/451* (2013.01)

(58) Field of Classification Search
CPC .............. H01L 29/7371; H01L 29/402; H01L 29/66242; H03F 3/19; H03F 2200/451
USPC ...................................................... 330/250
See application file for complete search history.

(56) References Cited

U.S. PATENT DOCUMENTS

| 9,324,846 B1 | 4/2016 | Camillo-Castillo et al. |
| 10,134,881 B1 | 11/2018 | Tao et al. |
| 2013/0099351 A1* | 4/2013 | Chen ................. H01L 29/66287 257/E29.174 |
| 2015/0263108 A1* | 9/2015 | Donkers ............ H01L 29/7378 438/316 |
| 2017/0373175 A1 | 12/2017 | Gu et al. |

FOREIGN PATENT DOCUMENTS

CN 102522425 B 4/2014

OTHER PUBLICATIONS

International Search Report and Written Opinion—PCT/US2020/016322—ISA/EPO—dated Apr. 23, 2020.

\* cited by examiner

*Primary Examiner* — Hafizur Rahman
(74) *Attorney, Agent, or Firm* — Haynes and Boone, LLP

(57) ABSTRACT

Aspects generally relate to a heterojunction bipolar transistor (HBT), and method of manufacturing the same. The HBT including an emitter a first, a first side of a base coupled to a second side of the emitter opposite the first side of the emitter. A collector coupled to the base on a second side of the base opposite the emitter, wherein an area of a junction between the base and the collector is less than or equal to an area of a junction between the base and the emitter. A dielectric coupled to the collector. A first conductive base contact coupled to the base and adjacent to the collector and extending over a base-collector junction, the conductive base contact operative as a field plate.

23 Claims, 10 Drawing Sheets

HETEROJUNCTION BIPOLAR TRANSISTOR WITH FIELD PLATES

BACKGROUND

I. Field of the Disclosure

Aspects of the disclosure relate generally to transistors, and in particular, to heterojunction bipolar transistors that can operate at high power and high speed.

II. Background

A bipolar transistor, also referred to as a bipolar junction transistor (BJT) is a type of transistor that uses both electron and hole charge carriers. A heterojunction bipolar transistor (HBT) is a type of bipolar transistor that uses different semiconductor materials for the junction between the emitter and base and the junction between the base and collector thereby creating heterojunctions. A HBT offers improvement over a conventional BJT in that it can handle signals of very high frequencies, up to several hundred GHz.

Power Amplifiers (PA) in radio frequency (RF) circuits can be implemented using HBT. Normally there is a tradeoff between power and speed of a PA implemented using HBT. For example, increasing the power of an HBT typically coincides with decreasing the operational speed of the HBT. In some applications, such as fifth generation (5G) wireless communication devices it is desirable for the Pas to operate at high power levels while also operating at very high speeds.

Therefore, there is a need for HBTs that operate at both high power and high speed.

SUMMARY OF THE DISCLOSURE

The described aspects generally relate to heterojunction bipolar transistors that can operate at high power and high speed In an aspect, a heterojunction bipolar transistor comprises an emitter coupled to a first surface of a base, and a collector coupled to a second surface of the base opposite the emitter. A dielectric layer covering at least portions of the collector not coupled to the base. A first base contact is coupled to the second surface of the base and adjacent the dielectric covering at least portions of the collector, the first base contact proximate to a base-collector junction. For example, the base contact can be directly coupled to the dielectric on the collector. In an aspect, a second base contact is coupled to the second surface of the base and adjacent the dielectric covering at least portions of the collector, the second base contact proximate to the base-collector junction. The base contact(s) can function as field plate(s) for the HBT.

In an aspect, the HBT also comprises a collector contact coupled to the collector and an emitter contact coupled to the emitter. The HBT can further comprise a dielectric layer isolating the base, collect and emitter contacts. In an aspect, the emitter contact provides access to the emitter on the same side of the base as the base contact. In an aspect, a width of the junction between the collector and base is less than or equal to a width of a junction between the base and the emitter. In an aspect, the junction between the base and collector is substantially a same width as the junction between base and emitter and is substantially aligned with the emitter. In an aspect, an HBT comprises a substrate, wherein the emitter contact is coupled to the substrate. The substrate can be silicon, copper, glass, or other material.

In an aspect, the HBT is a component of a radio frequency (RF) power amplifier. The RF power amplifier can transmit fourth generation (4G) RF signals, or fifth generation (5G) RF signals, such as sub-6 GHz and/or millimeter wave RF signals, or both.

In an aspect, a method of manufacturing a HBT comprises forming an emitter having a first side and a second side opposite the first side, an emitter contact coupled to the first side of the emitter, Forming a base having a first side coupled to the second side of the emitter opposite. Forming a collector having a first side coupled to the second side of the base opposite, forming a dielectric on at least portions of the collector not coupled to the base. Forming a base contract coupled to the second surface of the base and adjacent to the dielectric covering at least portions of the collector, the base contact proximate to a base-collector junction. In one embodiment, the base contact is directly coupled to the dielectric on the collector. The base contact can function as field plate for the HBT.

The method of manufacturing the HBT can further comprise forming a collector contact extending through the dielectric and coupled to the collector. In an embodiment, the emitter contact extends outside the base and provides access to the emitter contact on the same side of the base as the base contact and collector contact.

In an aspect, an area of the junction between the base and the collector is less than or equal to an area of a junction between the base and the emitter. In addition, a dielectric layer can be formed, isolating the base, collect and emitter contacts. In an aspect, a substrate is formed, wherein the emitter contact is coupled to the substrate. In an aspect, a second base contact can be formed and coupled to the second surface of the base and adjacent to the dielectric covering at least portions of the collector, the second base contact proximate to the base-collector junction.

In an aspect, the HBT can be in a radio frequency (RF) module. The RF module comprising a power amplifier comprising a HBT comprising an emitter coupled to a first surface of a base. A collector coupled to a second surface of the base opposite the emitter. A dielectric covering at least portions of the collector not coupled to the base. A first base contact coupled to the second surface of the base and adjacent the dielectric covering at least portions of the collector, the first base contact proximate to a base-collector junction.

In an aspect, the RF module, further comprises an antenna coupled to the power amplifier. In an aspect, the RF module, further comprising a power amplifier configured to transmit a fourth generation (4G) RF signal, a fifth generation (5G) RF signal, such as sub-6 GHz and/or millimeter wave RF signals, or both. The RF power amplifier, further comprising a collector contact coupled to the collector, a base contact coupled to the base, and an emitter contact coupled to the emitter. In an aspect, the RF module comprises a substrate coupled to the emitter contact. In an embodiment, the RF module comprises a dielectric isolating the base, collect and emitter contacts. In an embodiment, the RF module comprises a second base contact coupled to the base and adjacent the dielectric covering at least portions of the collector, the first base contact proximate the base-collector junction.

Various aspect and features of the disclosure are described in further detail below.

BRIEF DESCRIPTION OF THE FIGURES

The accompanying drawings are presented to aid in the description and illustrations of embodiments and are not intended to be limitations thereof.

The drawings may not depict all components of a particular apparatus, structure, or method. Further, like reference numerals denote like features throughout the specification and figures.

DETAILED DESCRIPTION

Figure 1:
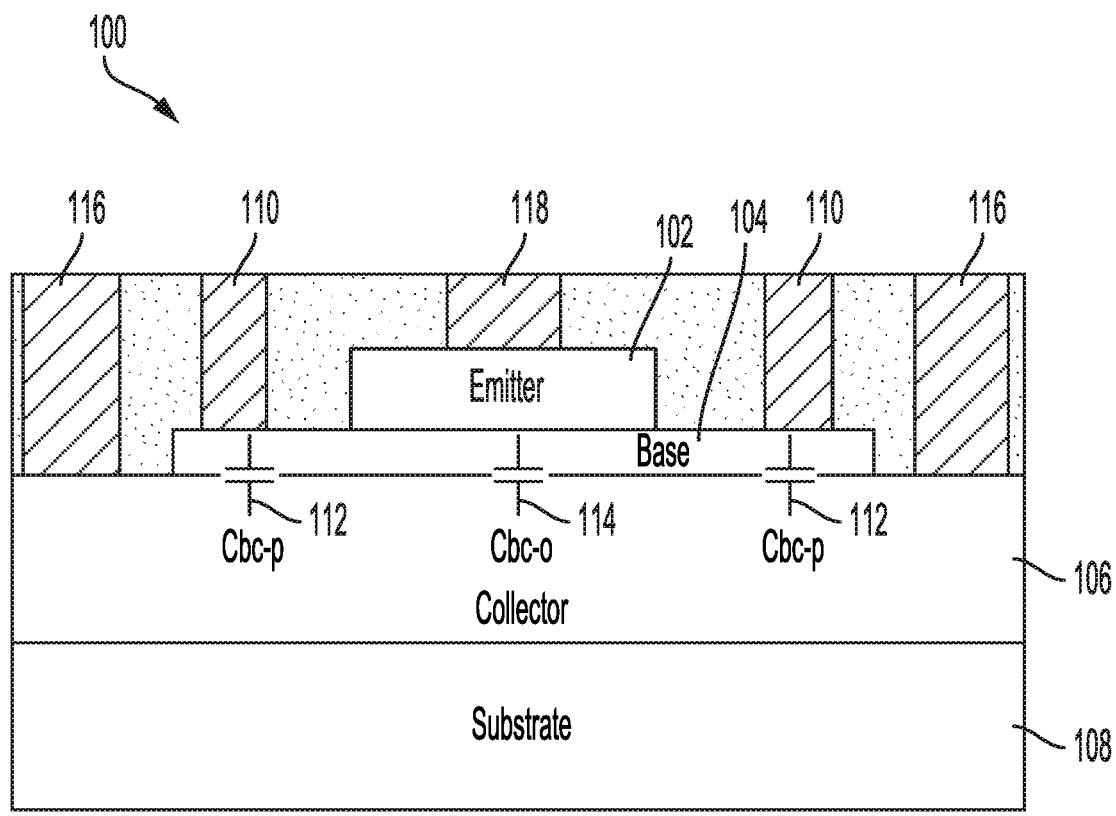
FIG. 1 is a simplified diagram of an exemplary conventional heterojunction bipolar transistor (HBT)

Aspects disclosed in the following description and related drawings are directed to specific aspects. Alternatives may be devised without departing from the scope of the invention. Additionally, well-known elements may not be described in detail, or may be omitted, so as not to obscure relevant details. Examples disclosed may be suitably included in any electronic device.

With reference now to the drawing, several exemplary aspects of the present disclosure are described. The word "exemplary" is used herein to mean "serving as an example, instance, or illustration." Any aspect described herein as "exemplary" is not necessarily to be construed as preferred or advantageous over other aspects. Furthermore, the terminology used herein is for the purpose of describing particular embodiments and is not intended to be limiting As described above, a disadvantage (of which there can be several) of conventional power amplifiers (PA) is that it is difficult to achieve both high power and high-speed operation of transistors of the PA, such as RF transistor, because there are usually tradeoff characteristics, i.e., an increase in one usually coincides with a decrease in the other. Johnson's figure of merit (JFM), which may be viewed as a measure of suitability of a semiconductor material for high frequency power transistor applications, is important in evaluating transistors, such as RF transistors.

JFM is a product of a breakdown voltage and a speed of the RF transistor, and may be expressed quantitatively in equation (1):

$$JFM = Vb \times Ft = Vb/2\pi\tau \qquad (1)$$

In equation (1), Vb represents the breakdown voltage, Ft represents the cutoff frequency, and τ represents the carrier transient time through the transistor. Improving the JFM of power transistors can be important. For example, a 5G system typically requires operating at very high frequency, e.g., milli meter Wave up to 100 GHz, while achieving a certain high output power. In other words, RF transistors used in PA should have both high Vb and high Ft at the same time.

FIG. 1 is a simplified diagram of an exemplary conventional heterojunction bipolar transistor (HBT) 100 that may be incorporated into a semiconductor device. The HBT 100 includes an emitter 102, a base 104, a collector 106, a substrate 108, two base contacts 110, two collector contacts 116, and an emitter contact 118. Note that although FIG. 1 illustrates two base contacts 110 and two collector contacts 116, there may be more or fewer than two base contacts 110 and/or collector contacts 116. The HBT 100 uses different semiconductor materials for the junction between the emitter 102 and the base 104 and the junction between the base 104 and the collector 106, thereby resulting in "heterojunctions." Further, the HBT 100 may utilize, for example, III-V semiconductor materials. The substrate 108 may be a III-V substrate, and may be, for example, silicon, gallium arsenide (GaAs), or indium phosphide.

As noted, it is desirable to have a transistor with a high Vb. In the conventional HBT 100, it is generally recognized that an increase in the thickness of the collector results in an increase in the breakdown voltage Vb. Thus, by increasing the collector 106 thickness, the HBT 100 can be operated with higher power, which is desirable. However, the increased collector thickness also results in an increase in the carrier transient time τ, which correspondingly reduces the frequency response, which is not desirable. According to equation (1), it is seen that with the conventional HBT 100, there is a tradeoff between achieving high power and high-speed.

Another aspect to high frequency operation of HBT 100 is the base-to-collector capacitance (Cbc) with a lower Cbc being desirable. The Cbc can be divided into two parts, the Cbc of the junction between the base 104 and the collector 106 underneath the emitter 102, referred to as Cbc-o 114, and the Cbc of the junction between the base 104 and the collector 106 outside of the area of the emitter 102, referred to as Cbc-p 112.

The Cbc-p 112 can be a significant portion of the overall Cbc. Accordingly, aspects provide an HBT that eliminates the Cbc-p 112 by removing the substrate (e.g., substrate 108) and patterning the collector 106 so that it is aligned to the emitter 102. Reducing Cbc improves the cutoff frequency Ft of the HBT transistor 100, While patterning the collector 106 so that it is aligned to the emitter 102 improves the cutoff frequency Ft it does not improve the breakdown voltage Vb of the HBT transistor 100.

In field effect transistors (FET) aspects to increase the breakdown voltage Vb of the FET include use of field plates (FPs). FPs can reduce peak electric fields in the FET transistor thereby increasing the breakdown voltage Vb of the transistor.

Figure 2:
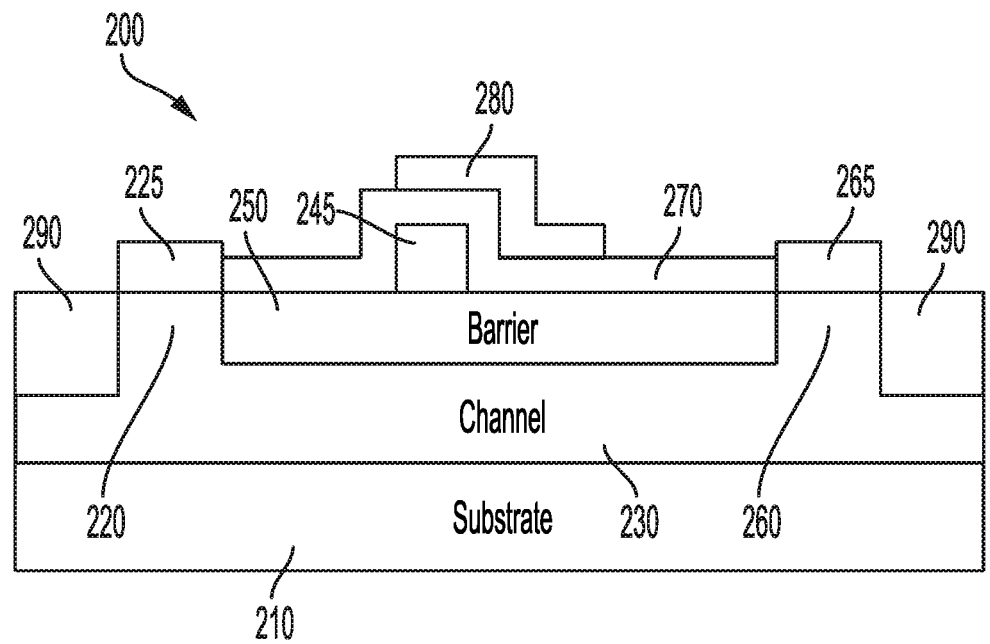
FIG. 2 illustrates an example of a field effect transistor (FET) or a high electron mobility transistor (HEMT) in which a field plate (FP) is utilized.

FIG. 2 illustrates an example of a field effect transistor (FET) or a high electron mobility transistor (HEMT) 200 in which a FP is utilized. The FET 200 includes a sapphire substrate 210, a GaN channel 230, source and drain 220, 260 formed in the channel 230, and a barrier layer 250 in between the source and the drain 220, 260. Isolation layers 290 isolate the FET 200. The channel 230 is N doped, and the source and the drain 220, 260 are N+ doped. Source and drain electrodes 225, 265 are respectively in electrical contact with the source and the drain 220, 260. A gate electrode 245 is on the barrier layer 250, and a passivation layer 270 encapsulates the gate electrode 245. A field plate (FP) 280 is formed on the passivation layer 270 above the gate electrode 245. The FP 280 is coupled to either the gate electrode 245 or the source electrode 225.

Figure 3:
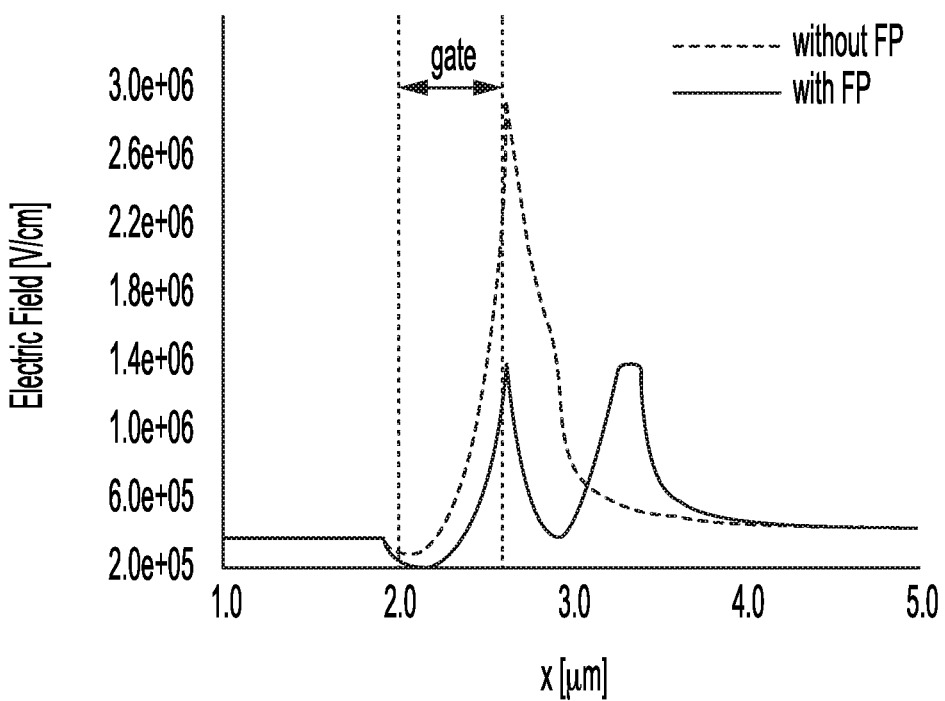
FIG. 3 illustrates an electric field along the channel of a FET such as the FET illustrated in FIG. 2.

FIG. 3 illustrates an electric field along the channel of a FET such as the FET 200 illustrated in FIG. 2. Note that without the FP 280, the electric field in the channel 230 can be very intense, especially near the gate electrode 245.

However, with the FP 280, the electric field intensity is significantly reduced. The peak electric field with the FP 280 is less than half the peak electric field without the FP 280. Also, the electric field within the channel 230 is more uniform with the FP 280. The reduced peak electric fields in the FET increase the breakdown voltage Vb of the transistor.

While use of FP can increase the breakdown voltage Vb of a FET implementing FPs in a HBT is a challenge due to the construction of the HBT device. Aspects include using a FB in a HBT to increase the breakdown voltage Vb while also decreasing the Cbc to increase the cutoff frequency Ft of the HBT device.

Figure 4:
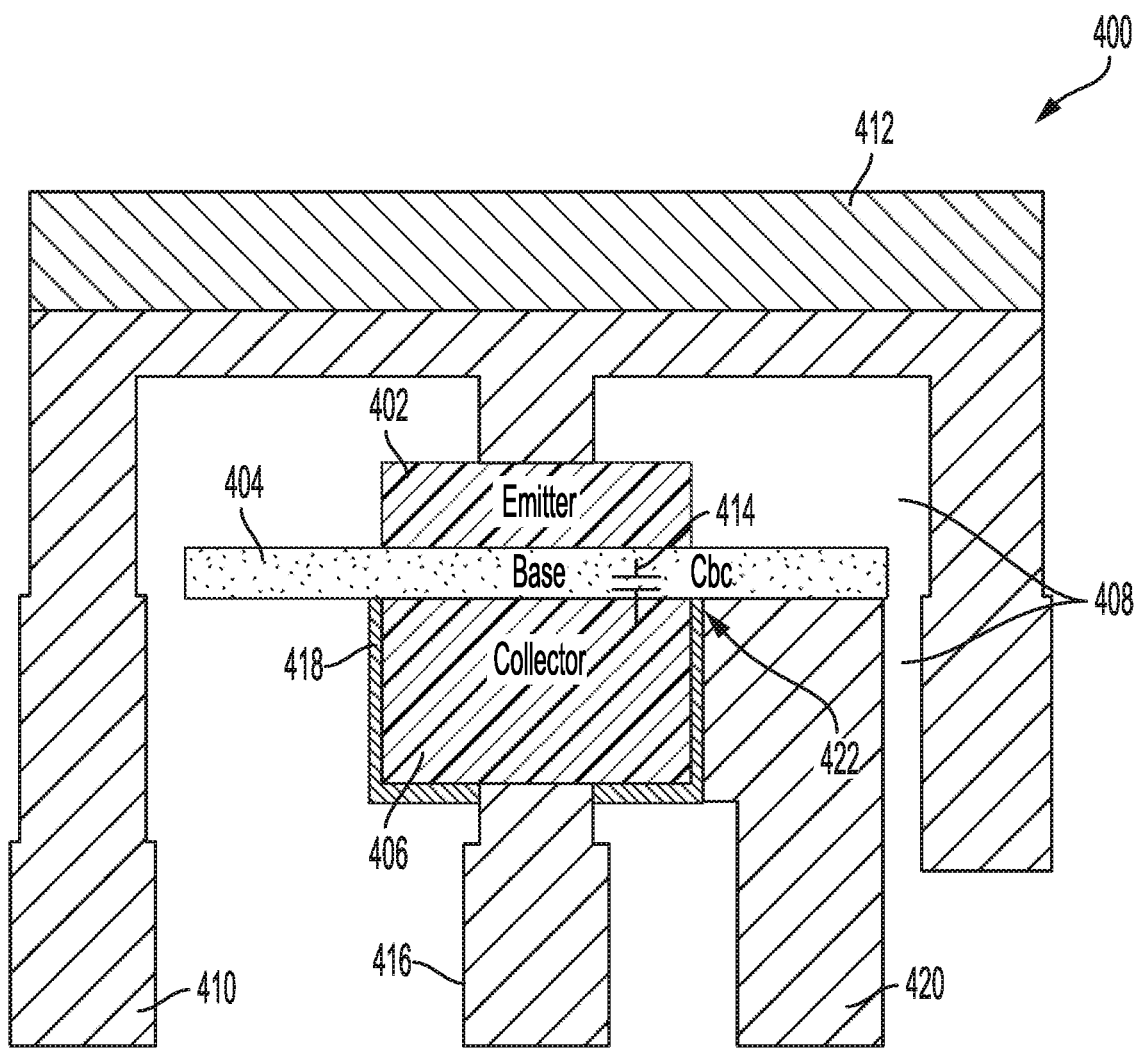
FIG. 4 is a simplified diagram of an HBT according to aspects described herein.

FIG. 4 is a simplified diagram of an exemplary HBT 400 according to at least one aspect of the disclosure. The HBT 400 includes an emitter 402, a base 404, a collector 406, a dielectric layer 408, a base contact 420, a collector contact 416, an emitter contact 410, and a support structure 412. As described herein, the base contact 420, collector contact 416, and emitter contact 410 are conductive, such as being made with copper, aluminum, of other conductive material. The HBT 400 uses different semiconductor materials for the junction between the emitter 402 and the base 404 and the junction between the base 404 and the collector 406, thereby resulting in heterojunctions.

As shown in the example of FIG. 4, the collector 406 is smaller than the base 404, and is substantially the same width as the emitter 402 such that the width of the junction between the collect 406 and the base 404 is equal to or less that the width of the junction between the emitter 402 and base 404. As can be seen in FIG. 4, the Cbc-p portion of the overall Cbc of the HBT 400 has been eliminated. The Cbc of the HBT 400 now only comprises the base 404 to collector 406 capacitance Cbc-o 414. Reducing the overall Cbc improves the cutoff frequency Ft of the HBT 400.

Emitter contact 410 is coupled to the emitter 402 to provide electrical connection to the emitter 402. Collector contact 416 is coupled to the collector 406 to provide electrical contact to the collector 406. A layer of SiN, or other dielectric material, 418 covers at least portions of the collector 406 not coupled to the base 402.

A base contact 420 is coupled to the base 404 to make electrical contact to the base 404. The base contact 420 is adjacent to the dielectric 418 covering at least some portions of the collector 406, and the base contact 420 proximate to the base collector junction 422. In one example, the base contact is coupled directly to the dielectric 418 on the collector 406. The base contact 420 being placed in this location functions as a FP for the HBT 400. With the base contact 420 functioning as a FP the electric field in the HBT 400 is more uniform, and the peak electric fields in the HBT 400 decrease thereby increasing the breakdown voltage Vb of the HBT 400.

The HBT 400 of FIG. 4 improves the cutoff frequency Ft of the HBT 400 by decreasing the Cbc, and also increases the breakdown voltage Vb of the HBT 400 by configuring the base contact 420 to function as a FP. Thus, HBT 400 can operate at both high power and high speed. In one example, the HBT 400 of FIG. 4 can be a component of a radio frequency (RF) power amplifier and can be configured to transmit fourth generation (4G) signals, or fifth generation (5G) RF signals such as sub 6 GHz or millimeter wave signals, or both.

In the example shown in FIG. 4, the width of the emitter 402 and collector 406 are substantially the same. In other examples the widths of the emitter 402 and collector 406 may be different than each other. For example, the emitter 402 can be wider or narrower than the width of the collector 406.

Figure 5:
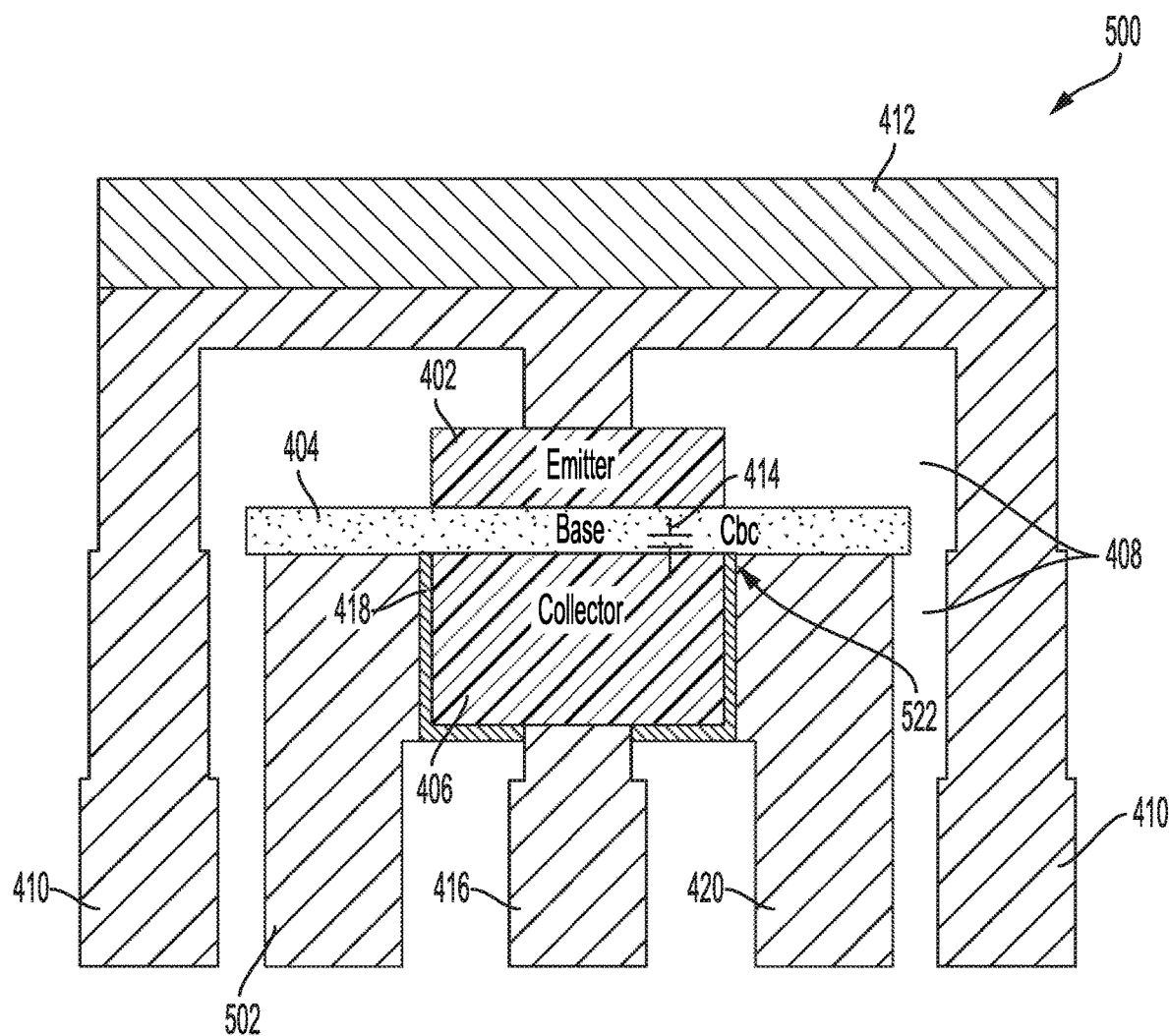
FIG. 5 is a simplified diagram of another HBT according to aspects described herein.

FIG. 5 is a simplified diagram of another example of an HBT 500. The HBT 500 in FIG. 5 is similar to the HBT 400 of FIG. 4 with the addition of a second base contact 502 coupled to the base 402 of the HBT 500. The second base contact 502 is adjacent to the dielectric 418 covering at least some portions of the collector 406, and the second base contact 502 is proximate to the base collector junction 422. In one example, the second base contact 502 is coupled directly to the dielectric 418 covering at least a portion of the collector 406. The second base contact 502 being placed in this location may function as an additional FP for the HBT 500. With the base contact 406 and second base contact 502 both functioning as a FP's the electric field may be more uniform in the HBT 500 than in the HBT 400 shown in FIG. 4, and the peak electric fields in the HBT 500 may further decrease thereby further increasing the breakdown voltage Vb of the HBT 500.

While the second base contact 502 in FIG. 5 is shown located on the opposite side of the collector 406 from the base contact 420, in other examples, the second base contact 502 can be located in other positions. In addition, there can be more than two base contacts located so as to function as additional field plates.

In one example, the HBTs of FIGS. 4 and 5 can be incorporated into an RF power amplifier in an RF module. The RF module can also include an antenna and can be configured to transmit 4G RF signals, or 5G RF signals, or both. For example, 5G signals can include sub-6 GHz signals or millimeter wave signals, or both.

Figure 6A:
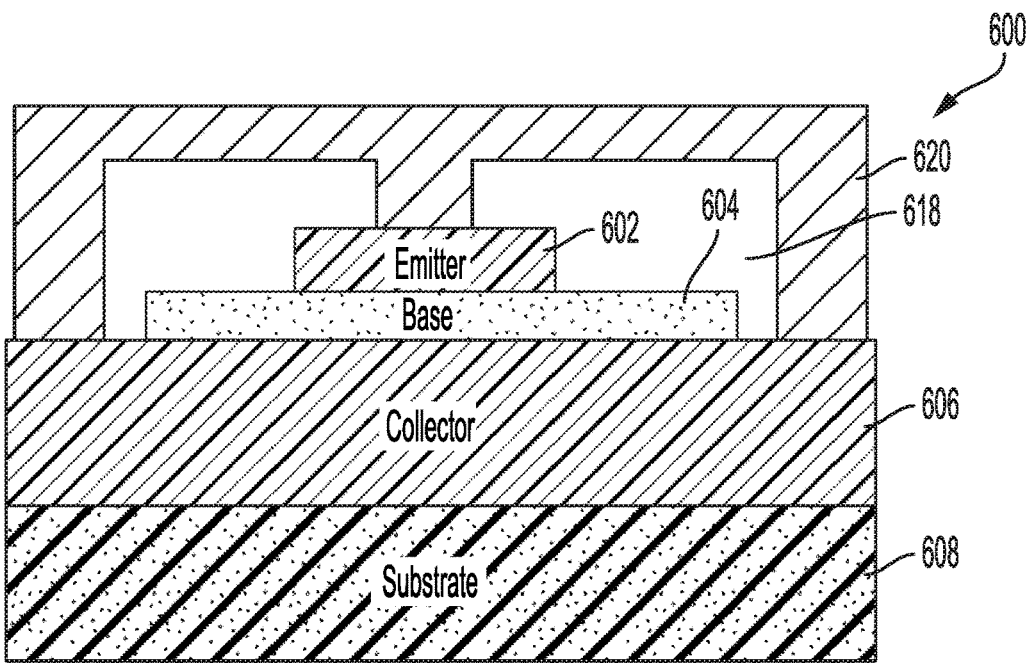
FIGS. 6A-6G illustrate a series of exemplary operations for fabricating an HBT according to at least one aspect of the disclosure.

FIGS. 6A-6G illustrate a series of exemplary operations for fabricating an exemplary HBT according to at least one aspect of the disclosure. In FIG. 6A, fabrication of an HBT according to aspects of the disclosure begins with an HBT structure 600 having an emitter 602, a base 604, a collector 606, and a substrate 608. The HBT of FIGS. 6A-6G uses different semiconductor materials for the junction between the emitter 602 and the base 604 and the junction between the base 604 and the collector 606, thereby resulting in "heterojunctions." Further, the HBT may utilize, for example, III-V semiconductor materials. The substrate 608 may be a III-V substrate, and may be, for example, silicon, gallium arsenide (GaAs), or indium phosphide.

A dielectric layer 618 is formed over some portions of the emitter 602, base 604, and the collector 606. An emitter contact 620 is formed over the dielectric layer 618 and extends through openings, for example etched openings, in the dielectric layer 618 to be coupled to the emitter 602 and collector 606.

Figure 6B:
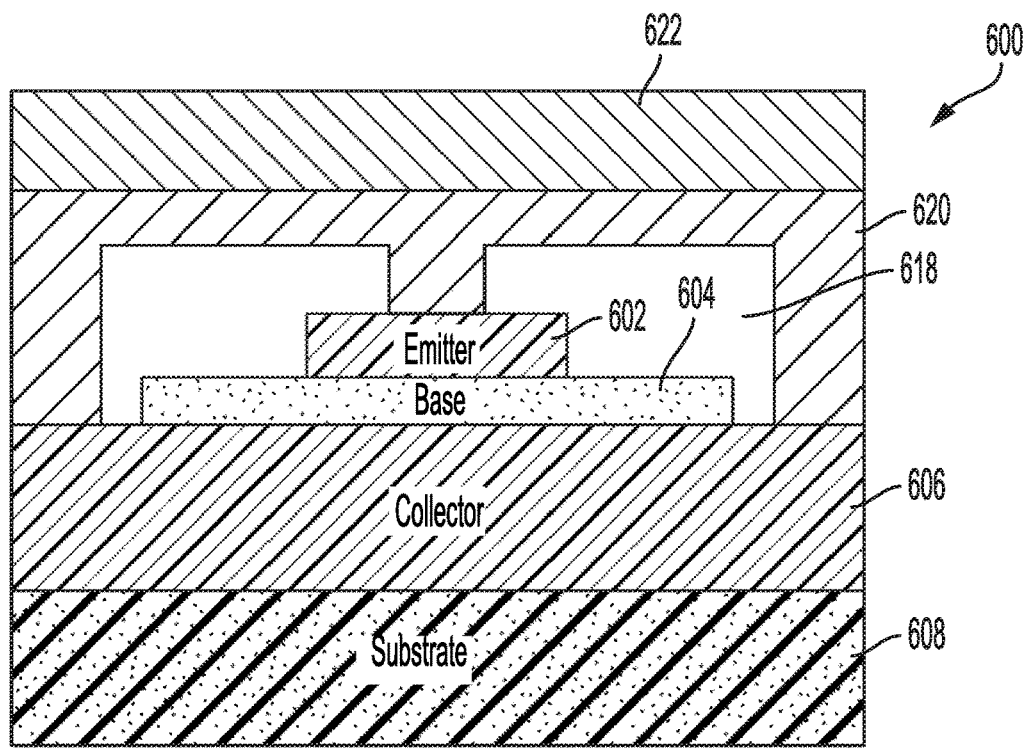

In the fabrication operation illustrated in FIG. 6B, the HBT structure 600 is bonded to a support structure 622. The support structure 622 may be formed of one or more different materials, for example, glass, silicon, or metal, such as copper. In one aspect, useful in a PA design, the emitter (e.g., emitter 602) may be conductively connected to ground. If copper is used as the support structure 622, it may provide higher electrical conductivity and a better electrical ground.

Figure 6C:
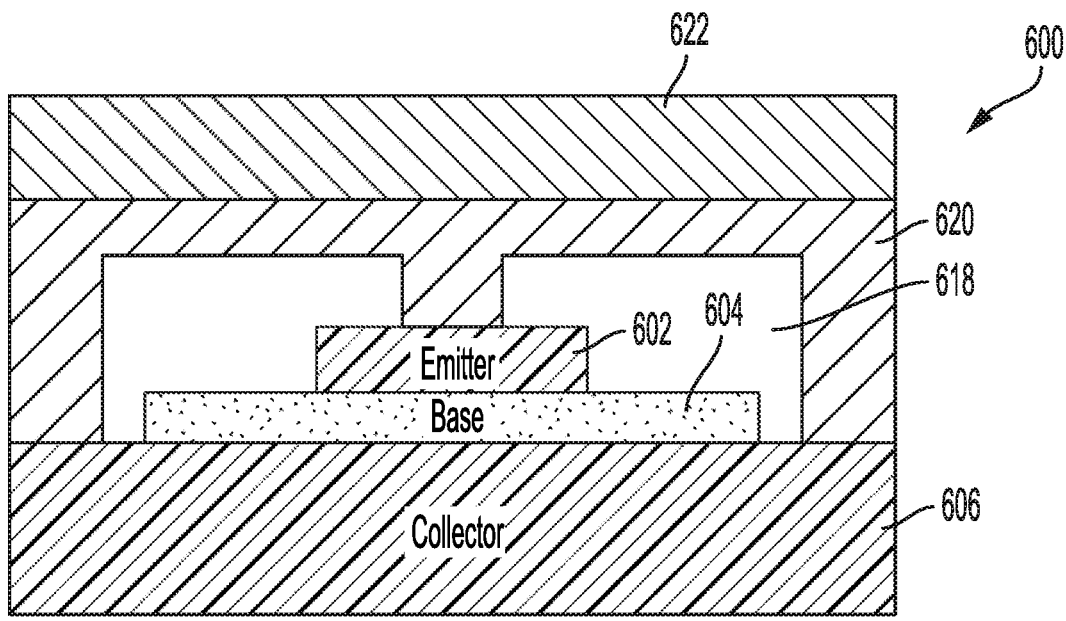

In the fabrication operation illustrated in FIG. 6C, the substrate 608 is removed from the HBT structure 600. The substrate 608 may be removed in different ways. For example, the substrate 608 may be removed by grinding or using selective etch, which stops at the collector 606.

Figure 6D:
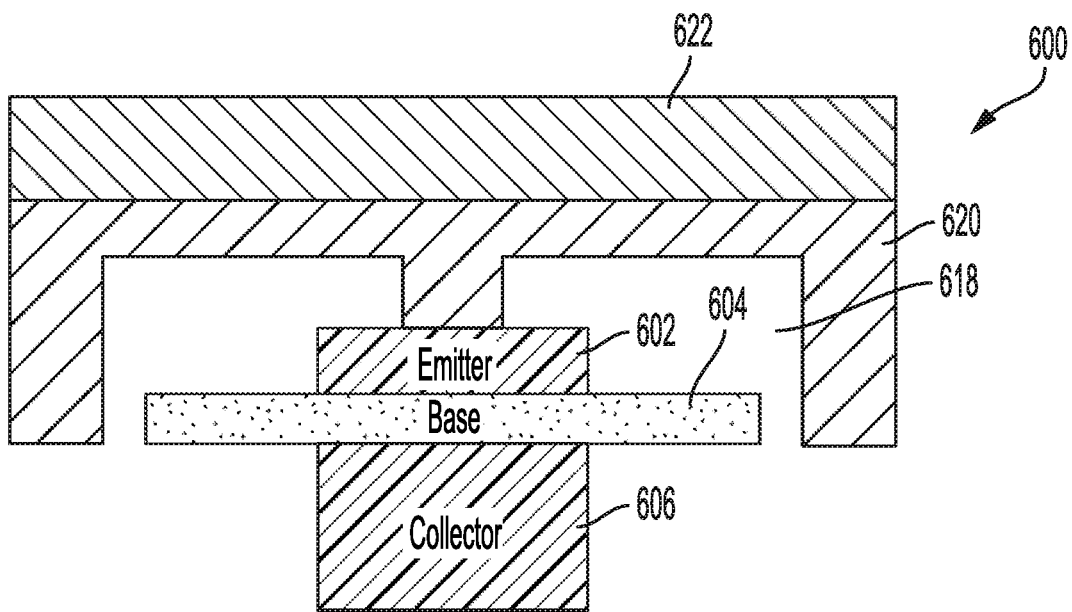

In the fabrication operation illustrated in FIG. 6D, the portion of the collector 606 outside of the area of the emitter 602 is removed exposing the base 604 and emitter contact 620. The collector 606 may be patterned using selective etch, which stops at the base 304. In the embodiment illustrated in FIG. 6D, the collector 606 width is approximately the same as the width of the emitter 602. In other embodiments, the collector 606 width may be wider or narrower than the width of the emitter 602.

Figure 6E:
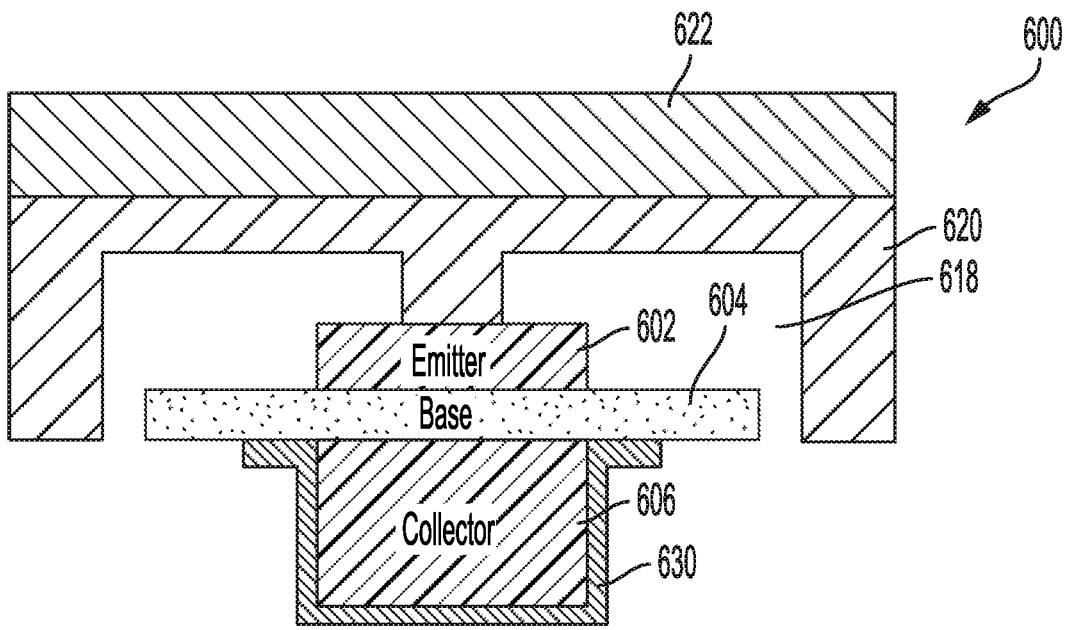

In the fabrication operation illustrated in FIG. 6E, a dielectric layer 630 is formed on the exposed sides and bottom of the collector 606 and extending onto a portion of the bottom of the base 604. In one embodiment, the dielectric layer 630 can be $Si_3N_4$, in other embodiments other dielectric materials can form the dielectric layer 630.

Figure 6F:
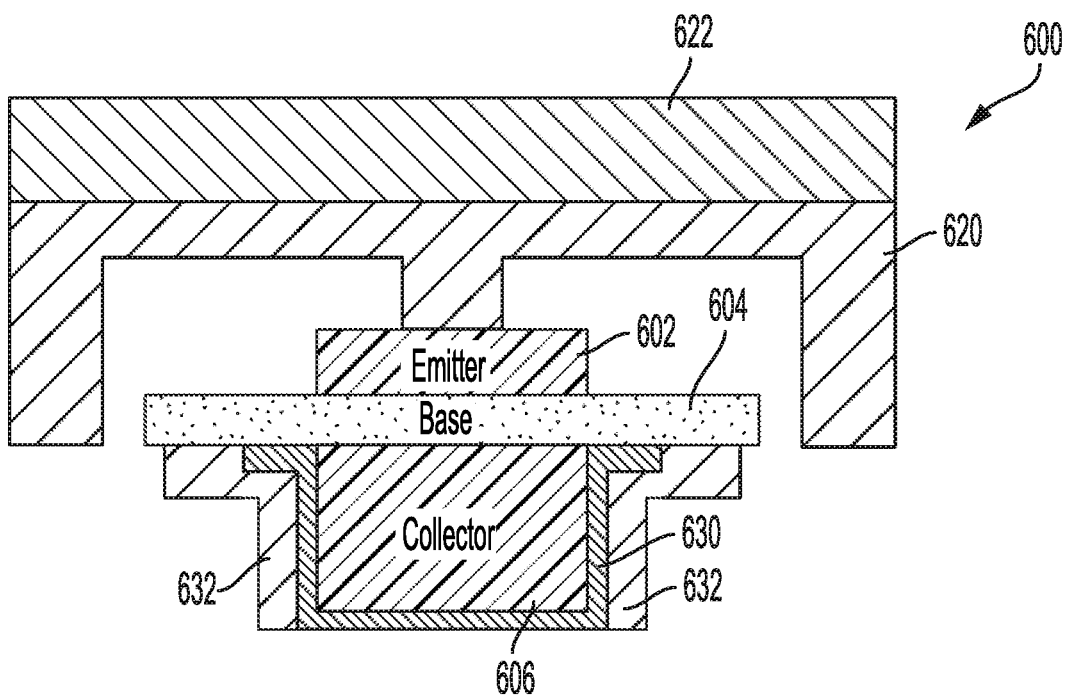

In the fabrication operation illustrated in FIG. 6F, a field plate layer 632 is formed on the sides of the dielectric layer 620 and onto the bottom of the base 604. The field plate layer 632 may be a conductive material, for example, copper, aluminum, or other metal. As noted above, having the conductive field plate 630 proximate to the base-collector junction reduces the peak electric field in the HBT 600 and also makes the electric field more uniform.

Figure 6G:
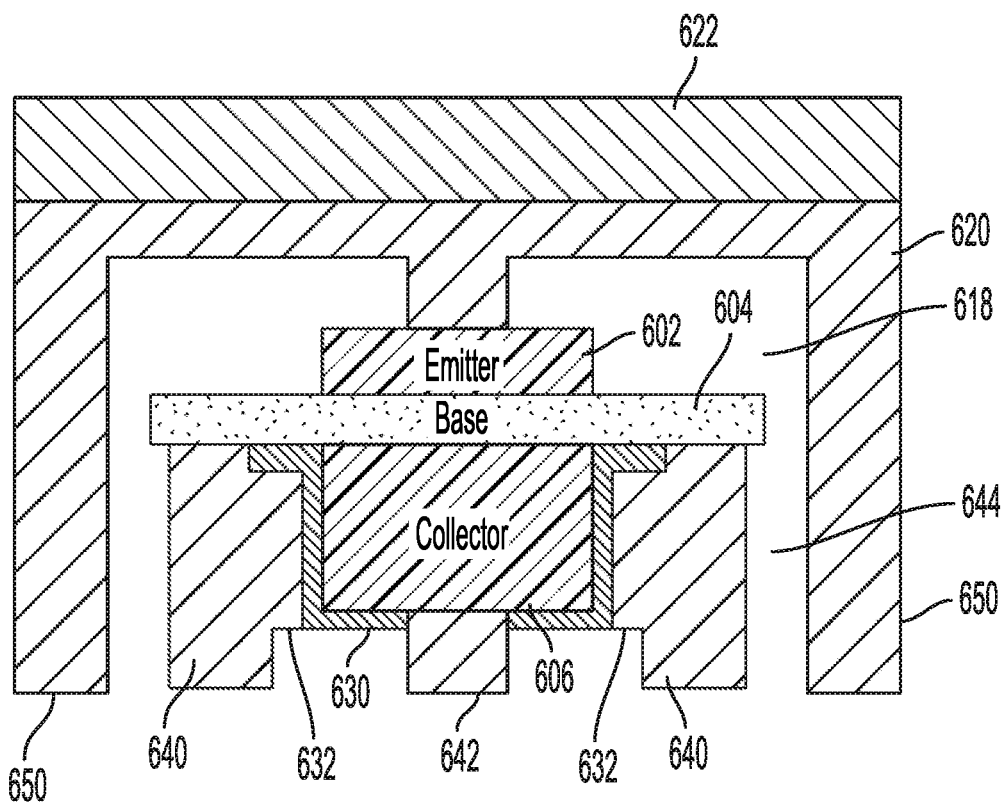

In the fabrication operation illustrated in FIG. 6G, base contacts 640 are coupled to the field plates 632 and the bottom of the base 604. A collector contact 642 extends through an opening in the dielectric layer 630 to couple to the bottom of the collector 606. The emitter contacts 620 are extended to be desired lengths. For example, the emitter contact 620, base contacts 640, and collector contact 642 can be fabricated such that their ends are coplanar. A dielectric layer, such as a passivation layer, 644 is added to the HBT structure 600. The dielectric layer 644 provides electrical isolation between the emitter contact 620, base contact 640 and collector contact 642. The dielectric layer 644 can also act as a passivation layer to protect the HBT. The dielectric layer 644 can be different materials, for example, silicon dioxide (SiO2), silicon nitride (SiN), polyimide, etc.

While the fabrication illustrated in FIGS. 6F and 6G show the field plates 632 and base contact 640 being formed as separate steps, in other embodiments the field plate 632 and base contact 640 can be formed at the same time as one continuous part. In other words, the base contact can be formed on the sides of the dielectric layer 620 and onto the bottom of the base 604 to form a base contact 640 that functions as a field plate.

After the fabrication operation illustrated in FIG. 6G, the HBT structure 600 is complete. If the HBT structure 600 is to be incorporated into a semiconductor device (not shown), then the HBT structure 600 may be mounted to the semiconductor device using conductive (e.g., copper) pillars (not shown) coupled to solder balls (not shown) or other connection techniques.

Figure 7:
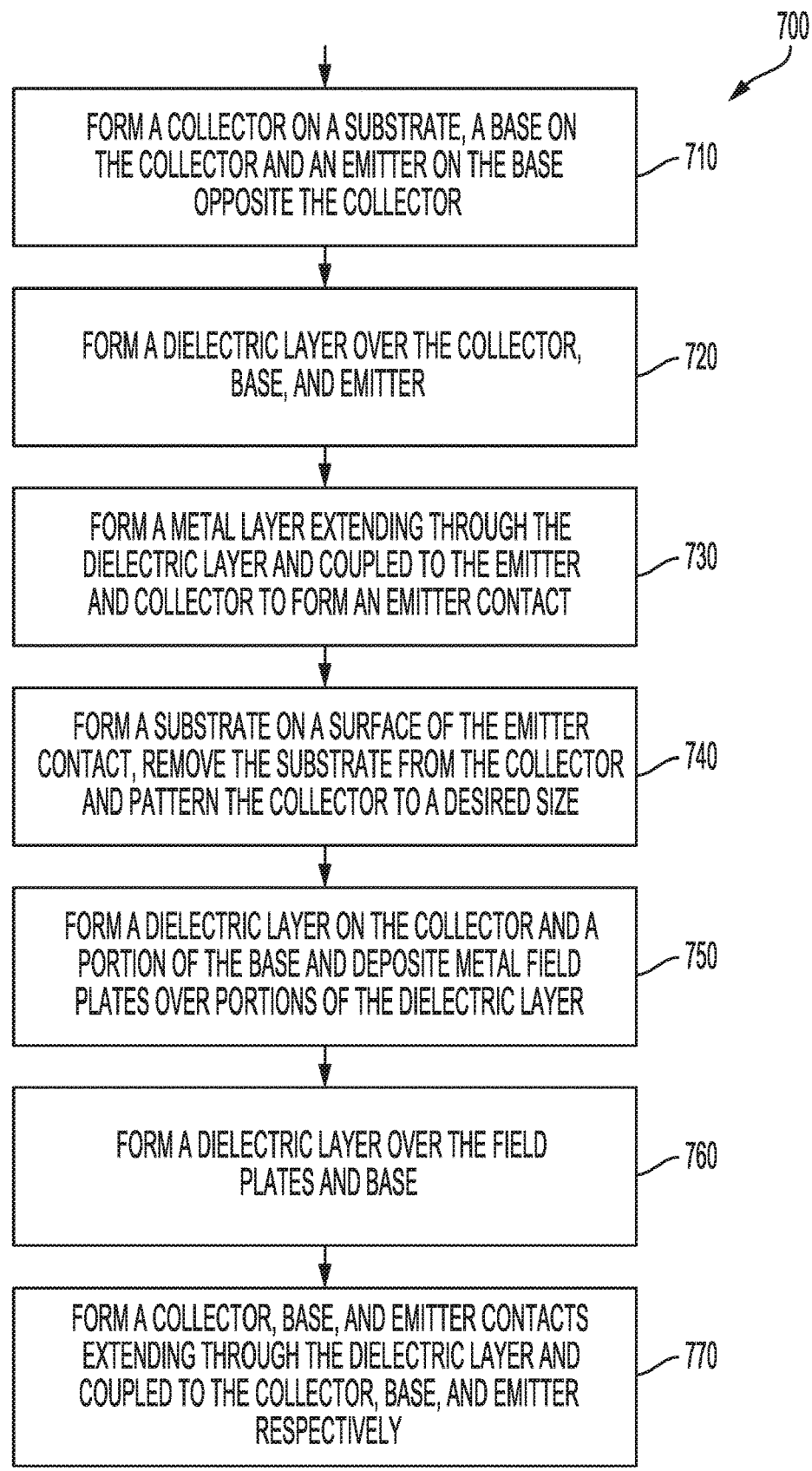
FIG. 7 is a flow chart of a non-limiting method to fabricate an HBT according to at least one aspect of the disclosure.

FIG. 7 is a flow chart of a method 700 to fabricate an HBT, such as the HBT 600 of FIG. 6. It should be noted that not all illustrated blocks for FIG. 7 need to be performed, i.e., some blocks may be optional. Also, the numerical references to the blocks in FIG. 7 should not be taken as requiring that the blocks should performed in a certain order, some blocks may be performed in different order and some blocks may be performed concurrently.

In block 710 a collector is formed on a substrate. A base is formed on a surface of the collector opposite the substrate and an emitter is formed on the base opposite the collector. In block 720 a dielectric layer is formed over the collector, base and emitter.

In block 730 a metal layer is formed over the dielectric layer. The metal layer extends through the dielectric layer and couple to the emitter to form an emitter contact, e.g. emitter contact 620. The metal layer may also extend through the dielectric layer and couple to the collector. As described further below, in later processing portions of the collector will be removed to expose any portions of the emitter contact 620 coupled to the collector thereby providing access to the emitter contact 620t.

In block 740 a substrate is formed on the metal layer. The substrate layer that the collector was formed on is removed to expose a surface of the collector. The collector is then patterned to a desired size. Patterning the collector expose ends of the emitter contact.

In block 750 a dielectric layer is formed on the collector and a portion of the base so that the dielectric layer covers the base-collector junction. Base contacts are formed over portions of the dielectric layer and extend over the base-collector junction. Field plates may be formed over portions of the dielectric layer and extend over the base-collector junction, the field plates may then be coupled to base contacts.

In block 760 a passivation layer is formed over the field plates, base, and exposed emitter contacts. In block 770 a collector contact is formed that extends through the passivation layer and the dielectric layer to couple to the collector. One or more base contacts extend through the passivation and couple to the base and field plates. Emitter contacts extend through the passivation layer and couple to the ends of the emitter contact.

Figure 8:
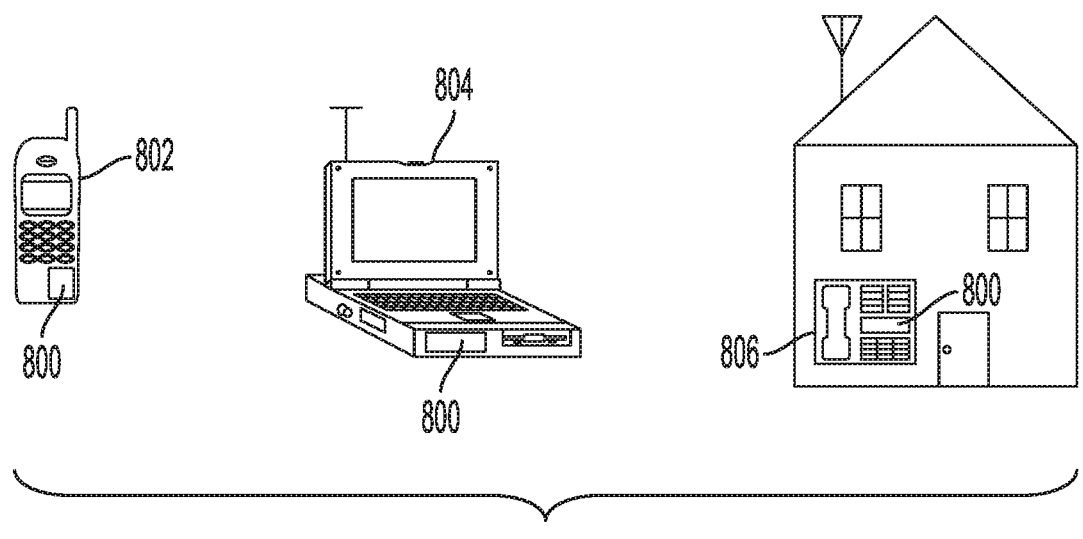
FIG. 8 illustrates various electronic devices that may be integrated with the aforementioned HBTs.

FIG. 8 illustrates various electronic devices that may be integrated with the aforementioned HBTs. For example, a mobile phone device 802, a laptop computer device 804, a terminal device 806 as well as wearable devices, portable systems, that require small form factor, extreme low profile, may include an apparatus 800 that incorporates the devices/systems as described herein. The apparatus 800 may be, for example, any of the integrated circuits, dies, integrated devices, integrated device packages, integrated circuit devices, device packages, integrated circuit (IC) packages, package-on-package devices, system-in-package devices described herein. The devices 802, 804, 806 illustrated in FIG. 8 are merely exemplary. Other electronic devices may also feature the apparatus 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

The various illustrative logical blocks, modules, and circuits described in connection with the aspects disclosed herein may be implemented or performed in an integrated circuit (IC), a system on a chip (SoC), an Application Specific Integrated Circuit (ASIC), a Field Programmable Gate Array (FPGA) or other programmable logic device, discrete gate or transistor logic, discrete hardware components, or any combination thereof designed to perform the functions described herein.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in flow chart diagrams may be subject to numerous different modifications as will be readily apparent to one of skill in the art The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A heterojunction bipolar transistor comprising:
    an emitter coupled to a first surface of a base;
    a collector coupled to a second surface of the base opposite the first surface of the base;
    a dielectric covering at least some portions of the collector not coupled to the base; and
    a base contact coupled to the second surface of the base and adjacent to the dielectric covering at least some portions of the collector, the base contact proximate to a base-collector junction so that the base contact acts as a field plate for the heterojunction bipolar transistor.

2. The heterojunction bipolar transistor of claim 1, further comprising a collector contact coupled to the collector and an emitter contact coupled to the emitter.

3. The heterojunction bipolar transistor of claim 2, further comprising a dielectric layer isolating the base, collect and emitter contacts.

4. The heterojunction bipolar transistor of claim 2, wherein the emitter contact provides access to the emitter on the same side of the base as the base contact.

5. The heterojunction bipolar transistor of claim 2, further comprising a substrate, wherein the emitter contact is coupled to the substrate.

6. The heterojunction bipolar transistor of claim 5, wherein the substrate comprises silicon, copper, or glass.

7. The heterojunction bipolar transistor of claim 1, wherein the base-collector junction is substantially a same width as a junction between base and emitter and is substantially aligned with the emitter.

8. The heterojunction bipolar transistor of claim 1, wherein the heterojunction bipolar transistor is a component of a radio frequency (RF) power amplifier.

9. The heterojunction bipolar transistor of claim 8, wherein the RF power amplifier is configured to transmit fifth generation (5G) RF signals.

10. The heterojunction bipolar transistor of claim 1, further comprising a second base contact coupled to the second surface of the base and adjacent to the dielectric covering at least some portions of the collector, the second base contact proximate to the base-collector junction.

11. A method of manufacturing a heterojunction bipolar transistor comprising:
    forming an emitter having a first side and a second side opposite the first side;
    forming a base having a first side and a second side opposite the first side, the first side coupled to the second side of the emitter;
    forming a collector having a first side coupled to a second side of the base opposite the first side of the base;
    forming a dielectric on at least portions of the collector not coupled to the base; and
    forming a base contact coupled to the second side of the base and adjacent to the dielectric on at least portions of the collector, the base contact proximate to a base-collector junction so that the base contact acts as a field plate for the heterojunction bipolar transistor.

12. The method of claim 11, further comprising
    forming an emitter contact coupled to the first side of the emitter;
    forming a collector contact extending through the dielectric on at least portions of the collector and coupled to the collector;
    wherein the emitter contact provides access to the emitter on the same side of the base as the base contact and collector contact.

13. The method of claim 12, further comprising forming a dielectric layer isolating the base, collect and emitter contacts.

14. The method of claim 12, further comprising forming a substrate, wherein the emitter contact is coupled to the substrate.

15. The method of claim 11, wherein a width of a junction between the base and the collector is less than or equal to a length of a junction between the base and the emitter.

16. The method of claim 11, further comprising forming a second base contact coupled to the second side of the base and adjacent to the dielectric on at least portions of the collector, the second base contact proximate the base-collector junction.

17. A radio frequency (RF) module comprising:
    a power amplifier comprising a heterojunction bipolar transistor comprising:
        an emitter coupled to a first surface of a base;
        a collector coupled to a second surface of the base, the second surface of the base opposite the first surface of the base;
        a dielectric covering at least portions of the collector; and
        a first base contact coupled to the second surface of the base and adjacent the dielectric covering at least portions of the collector, the first base contact proximate a base-collector junction so that the first base contact acts as a field plate for the heterojunction bipolar transistor.

18. The RF module of claim 17, with the power amplifier further comprising a collector contact coupled to the collector and an emitter contact coupled to the emitter.

19. The RF module of claim 18, with the power amplifier further comprising a substrate coupled to the emitter contact.

20. The RF module of claim 18, with the power amplifier further comprising a dielectric isolating the base, collect and emitter contacts.

21. The RF module of claim 17, with the power amplifier further comprising a second base contact coupled to the second surface of the base and adjacent the dielectric covering at least portions of the collector, the second base contact proximate to the base-collector junction.

22. The RF module of claim 17, further comprising an antenna coupled to the power amplifier.

23. The RF module of claim 22, with the power amplifier configured to transmit a fifth generation (5G) RF signal.

* * * * *